United States Patent
Buijsse et al.

(10) Patent No.: US 9,129,774 B2
(45) Date of Patent: Sep. 8, 2015

(54) METHOD OF USING A PHASE PLATE IN A TRANSMISSION ELECTRON MICROSCOPE

(71) Applicants: FEI Company, Hillsboro, OR (US);
Max-Planck-Gesellschaft zur Foerderung der Wissenschaften e. V., Munich (DE)

(72) Inventors: Bart Buijsse, Eindhoven (NL); Radostin Stoyanov Danev, Munich (DE)

(73) Assignees: FEI COMPANY, Hillsboro, OR (US); MAX-PLANCK-GESELLSCHAFT ZUR FÖRDERUNG DER WISSENSCHAFTEN E. V., Munich (DE)

( * ) Notice: Subject to any disclaimer, the term of this patent is extended or adjusted under 35 U.S.C. 154(b) by 0 days.

(21) Appl. No.: 14/262,340

(22) Filed: Apr. 25, 2014

(65) Prior Publication Data

US 2014/0326876 A1     Nov. 6, 2014

(30) Foreign Application Priority Data

Apr. 25, 2013  (EP) .................................... 13165356
Aug. 14, 2013  (EP) .................................... 13180361
Oct. 28, 2013  (EP) .................................... 13190405

(51) Int. Cl.
*H01J 37/26*     (2006.01)
*G21K 5/04*      (2006.01)
*H01J 37/285*    (2006.01)

(52) U.S. Cl.
CPC ............. *H01J 37/263* (2013.01); *H01J 37/285* (2013.01); *H01J 2237/2614* (2013.01)

(58) Field of Classification Search
USPC .............. 250/305, 306, 307, 310, 311, 492.1, 250/492.3
See application file for complete search history.

(56) References Cited

U.S. PATENT DOCUMENTS 3,908,124 A    9/1975  Rose
5,814,815 A    9/1998  Matsumoto et al.
(Continued)

FOREIGN PATENT DOCUMENTS

EP    1476890    11/2004
JP     607048     1/1985
(Continued)

OTHER PUBLICATIONS

Johnson, H.M., "In-Focus Phase Contrast Electron Microscopy", Principles and Techniques of Electron Microscopy, Electron Optics Laboratory, Dept. of Biophysics, 1973, pp. 174-177, Roswell Park Memorial Institute, Buffalo, N.Y.

(Continued)

*Primary Examiner* — Nicole Ippolito
(74) *Attorney, Agent, or Firm* — Scheinberg & Associates PC; Michael O. Scheinberg; Nathan H. Calvert

(57) ABSTRACT

The invention relates to a method of using a phase plate, having a thin film, in a transmission electron microscope (TEM), comprising: introducing the phase plate in the TEM; preparing the phase plate by irradiating the film with a focused electron beam; introducing a sample in the TEM; and forming an image of the sample using the prepared phase plate, wherein preparing the phase plate involves locally building up a vacuum potential resulting from a change in the electronic structure of the thin film by irradiating the phase plate with a focused beam of electrons, the vacuum potential leading to an absolute phase shift |φ| with a smaller value than at the non-irradiated thin film. Preferably the phase plate is heated to avoid contamination. The phase shift achieved with this phase plate can be tuned by varying the diameter of the irradiated spot.

20 Claims, 4 Drawing Sheets

(56) References Cited

U.S. PATENT DOCUMENTS

Figure 1:
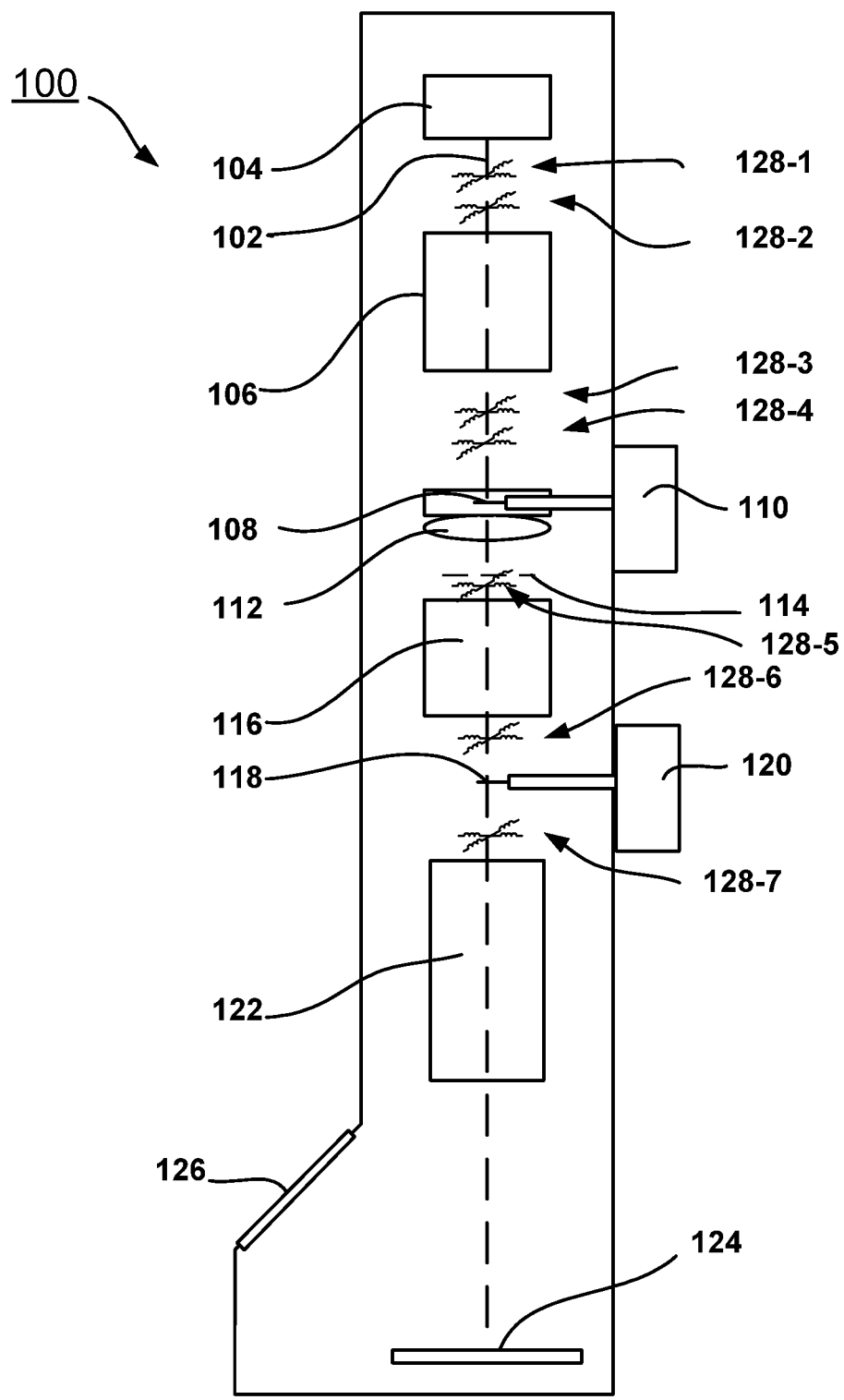

| | | |
|---|---|---|
| 6,548,810 B2 | 4/2003 | Zaluzec |
| 6,674,078 B2 | 1/2004 | Nagayama et al. |
| 6,744,048 B2 | 6/2004 | Hosokawa et al. |
| 6,797,956 B2 | 9/2004 | Benner |
| 7,737,412 B2 | 6/2010 | Jin et al. |
| 7,741,602 B2 | 6/2010 | Benner et al. |
| 7,851,757 B2 | 12/2010 | Nagayama |
| 7,902,506 B2 | 3/2011 | Schroder et al. |
| 7,915,584 B2 | 3/2011 | Tiemeijer et al. |
| 7,928,379 B2 | 4/2011 | Zach |
| 7,977,633 B2 | 7/2011 | Barton et al. |
| 8,071,954 B2 | 12/2011 | Wagner et al. |
| 8,633,456 B2 | 1/2014 | Buijsse et al. |
| 8,637,821 B2 | 1/2014 | Buijsse et al. |
| 8,772,716 B2 | 7/2014 | Buijsse |
| 2002/0011566 A1 | 1/2002 | Nagayama et al. |
| 2008/0202918 A1 | 8/2008 | Nagayama et al. |
| 2009/0166558 A1 | 7/2009 | Nagayama |
| 2010/0065741 A1 | 3/2010 | Gerthsen et al. |
| 2011/0174971 A1* | 7/2011 | Malac et al. .................. 250/307 |
| 2014/0061463 A1 | 3/2014 | Buijsse et al. |

FOREIGN PATENT DOCUMENTS

| | | |
|---|---|---|
| JP | 2000268765 | 9/2000 |
| JP | 2001084938 | 3/2001 |
| JP | 2005116365 | 4/2005 |
| WO | 2009122145 | 10/2009 |
| WO | 2011071819 | 6/2011 |

OTHER PUBLICATIONS

Unwin, P.N.T., "Phase contrast electron microscopy of biological materials", Journal of Microscopy, Aug. 1973, pp. 299-312, vol. 98, Pt. 3.

* cited by examiner

METHOD OF USING A PHASE PLATE IN A TRANSMISSION ELECTRON MICROSCOPE

The invention relates to a method of using a phase plate in a transmission electron microscope, the phase plate comprising a thin film, the method comprising: introducing the phase plate in the transmission electron microscope; preparing the phase plate by irradiating the film with a focused electron beam; introducing a sample in the transmission electron microscope; and forming an image of a sample using the prepared phase plate.

This method is known from "Principles and Techniques of Electron Microscopy, Vol. 3: Biological applications", Ed. M. A. Hayat, ISBN-0-442-25674-4, Chapter 4: In-focus phase contrast electron microscopy, H. M. Johnson, Electron Optics Laboratory, Dept. of Biophysics, Roswell Park Memorial Institute, Buffalo, N.Y., USA, specifically page 174-176

In a Transmission Electron Microscope (TEM) a sample is imaged by passing a beam of energetic electrons with a selectable energy of, for example, between 40 keV and 400 keV, through the sample. For so-called weak-phase samples, such as biological samples, most electrons pass through the sample while some electrons are elastically or inelastically scattered, the elastically scattered electrons forming diffracted beams. The image is formed by interference of the elastically scattered and unscattered electrons (diffracted and undiffracted beams).

A problem arises in that the Contrast Transfer Function (CTF) for low spatial frequencies in the image is zero or close to zero, resulting in low visibility of large objects/structures. This is caused by the fact that a camera or fluorescent screen at the image plane is sensitive to intensity variations, but not to phase variations of the impinging electron beam.

A solution to this is the use of a phase plate, the phase plate introducing a phase difference between the diffracted beams and the undiffracted beam. There are two main types of phase plates: the so-called Zernike phase plate leaves the undiffracted beam unchanged, and causes a phase shift of the diffracted beams, while the so-called Boersch phase plate shifts the undiffracted beam while leaving the diffracted beams unchanged.

The introduction of the phase difference by the phase plate changes the sine-like behavior of the CTF to a cosine-like behavior, and thus a maximum contrast for low spatial frequencies. For a more thorough description of phase plates and other contrast enhancing devices see "Phase Contrast Enhancement with Phase Plates in Biological Electron Microscopy", K. Nagayama et al., Microscopy Today, Vol. 18 No. 4 (July 2010), pp. 10-13, further referred to as Nagayama [—2—].

A problem of both Boersch phase plates and Zernike phase plates is that they require microscopic holes (typically less than 1 μm) and a centering accuracy which is even an order of magnitude better than the hole size.

Another type of phase plate is the phase plate, as first described by Johnson [—1—]. The phase plate described by Johnson is formed by a contamination spot on a continuous carbon film. This spot is formed using the electron beam in high current mode. The contamination spot modifies the thickness of the film, resulting in a thicker part. This film can then, at lower current, be used as a phase plate, where the undiffracted electrons, passing through the thick spot, experience a larger (negative) phase shift than the diffracted electrons passing through the non-contaminated (or less-contaminated) film. The effect of such a phase plate thus resembles the effect of Zernike phase plate, but with the difference that this phase plate gives a negative phase contrast.

An advantage of such a phase plate is that it is self-building and thus centered.

A disadvantage of this phase plate is that the build-up of contaminants is difficult to control, thus hampering practical use of the device It is noted that electrons travelling through a thin film experience a negative phase shift relative to electrons travelling the same distance in vacuum, as the material has a positive inner potential, thus accelerating the electrons inside the material. Electrons travelling in a material are thus advanced with respect to electrons that do not travel through the material, resulting in said negative phase shift. As this is often misunderstood, often the absolute phase shift $|\phi|$ is referred to.

Another such phase plate is known from U.S. patent application No. U.S. 2011/0174971A1, describing a film exposed to an electron beam, resulting in positive charging (due to secondary electron emission) and/or contamination (or the charging of contamination).

Inventors found as a disadvantage of this phase plate that keeping the charging constant is quite difficult, and results in hard to control operation.

There is a need for a reliable, self-centered phase plate.

The invention intends to provide a solution.

To that end the method of the invention is characterized in that preparing the phase plate involves locally building up a vacuum potential resulting from a change in the electronic structure of the thin film by irradiating the phase plate with a focused beam of electrons, the vacuum potential leading to a phase shift that is less than at the non-irradiated thin film.

Inventors found that by irradiating the thin film with electrons in an environment where contamination was absent, or negligible, a change in imaging could be observed resulting in a positive phase contrast (contrary to the negative phase contrast observed by Johnson). Such a contamination-free condition can simply be generated by heating the film to a temperature above approximately 200° C. As this is a positive phase contrast, this is easily identified to differ from the positive phase contrast occurring by contamination or positive charging, and must concern another principle.

Inventors bring forward that this positive phase contrast is based on a change of the electronic structure of the material.

Each material has a chemical potential μ that depends not only on the materials composition, but also on its phase, crystallographic properties, etc. The chemical potential is related to the electrochemical potential according to $$\bar{\mu} = \mu - q\Psi$$

with $\bar{\mu}$ the electrochemical potential, μ the chemical potential, q the elemental charge and Ψ the inner potential of the material. When two conducting materials are electrically connected, the electrochemical potential $\bar{\mu}$ is necessarily equalized, and any difference in chemical potential thus results in a different inner potential. The difference in inner potential between the two materials is called a Galvani potential. In the vacuum also a potential difference will arise; this potential is called a Volta potential. It differs from the Galvani potential by the difference in surface potential between the two materials. This Volta potential is responsible for the difference in phase shift of electrons passing the two materials, not the Galvani potential inside the film. The reason is that the Volta potential extends into the vacuum over a distance that is large compared to the film thickness.

As is known from, for example, semiconductor materials, irradiation of a material with a beam of electrons results in bond-breaking, creating electron trapping centra that may act as p-type dopants. This may result in a material with a lower chemical potential, where electrons flow toward the p-doped area and create a negative potential. This way a Galvani potential can be established between the irradiated and non-irradiated area, and in the vacuum a Volta potential is established.

In the following reference is made to the more general phrase "vacuum potential" for the potential in the vacuum, which including the effect of the Volta potential (and possible other potentials).

It is therefore concluded that the irradiation with the beam locally modifies the material, possibly by bond-breaking and/or the corresponding formation of p-type dopant positions.

Inventors found that the effect is dependent on the amount of electrons deposited on the thin film, and on the size of spot exposed: a large dose results in a large phase shift, and a large spot irradiated with an identical current density results in a large phase shift. However, the phase shift is not a linear function of the deposited dose, but increases up to some maximum value that corresponds with a steady state that establishes itself. The process of setting up the vacuum potential, thereby creating the phase plate, will be referred to hereafter as conditioning of the film.

Inventors also found that the effect returned to its normal state, and a phase plate according to the invention using a thin film of amorphous carbon must be conditioned anew with the electron beam after approximately one day.

It is noted that the irradiation of the thin film during conditioning is insufficient to burn a hole in the thin film. In other words: the non-diffracted beam passes through thin film material as well as diffracted electrons.

It is further noted that the current and current density of the spots formed by diffracted electrons is in normal use (in imaging mode) insufficient to cause a noticeable change in vacuum potential.

Preferably the phase plate is operated in a heated condition, thereby avoiding contamination. The heating can be achieved by e.g. laser heating of the thin film, or by heating of a part of a holder holding the thin film (typically an aperture mechanism), for example by ohmic heating.

Should the phase plate deteriorate at the position used, it is well possible to use another part of the thin film and condition that part by irradiating the new position with electrons.

In low-dose applications it is important that the phase plate conditioning is done while the sample area of interest is not exposed simultaneously. This can be achieved by applying a beam (and image) shift while conditioning the phase plate. In order to ensure that the conditioning is done at the proper phase plate position it is important that the beam shift pivot point setting is done very accurately. Properly chosen pivot points results in a stationary beam at the phase plate position while shifting the beam in the sample plane.

It may be advantageous to condition a larger area of the thin film than the area that is exposed to the unscattered beam during imaging. In other words, conditioning can be done working slightly off plane, while imaging is done in the in-plane condition. The conditioned area, say 100 nm, is then much larger than the diameter of the focused unscattered beam, say 10 nm. This has the advantage that the beam shift pivot point setting accuracy can be relaxed somewhat. It also has the advantage that a small amount of drift of the electron beam with respect to the phase plate can be tolerated during imaging.

The thin film may further show markers, for example to help aligning the transmission electron microscope, for example for accurately setting up of beam shift pivot points, for finding the in-plane condition and for setting the condenser stigmator. These markers are preferably holes in the film, and not physical markers. Physical markers may lead to contamination of the film by diffusion processes. The holes preferably have a diameter of 1 micrometer or less, to be able to accurately set the in-plane condition. Furthermore, they preferably have a circular shape, which simplifies the tuning of the stigmator. Finally, it is convenient if the markers are positioned in a dense pattern that covers an area of, for example, $100 \times 100$ $\mu m^2$. This way it is easy to find an (arbitrary) hole without having to rely on an accurate navigation protocol to find the alignment feature.

It is noted that these holes are used for navigation purposes, and not to introduce phase difference between diffracted and non-diffracted electrons as occurring in a Zernike phase plate.

Preferably the thin film is a carbon film, more specifically an amorphous thin film, although the use of SiN, SiB, SiC and Si films is known as well.

It is noted that the thickness of the film is such that electron loss by scattering on the phase plate is minimal. Unlike the thin film Zernike phase plate, there is no need to tune the thickness to the desired phase shift, because the phase shift is generated by a vacuum potential. For a carbon film, the smallest thickness that is feasible is around 10 nm.

Figure 2:
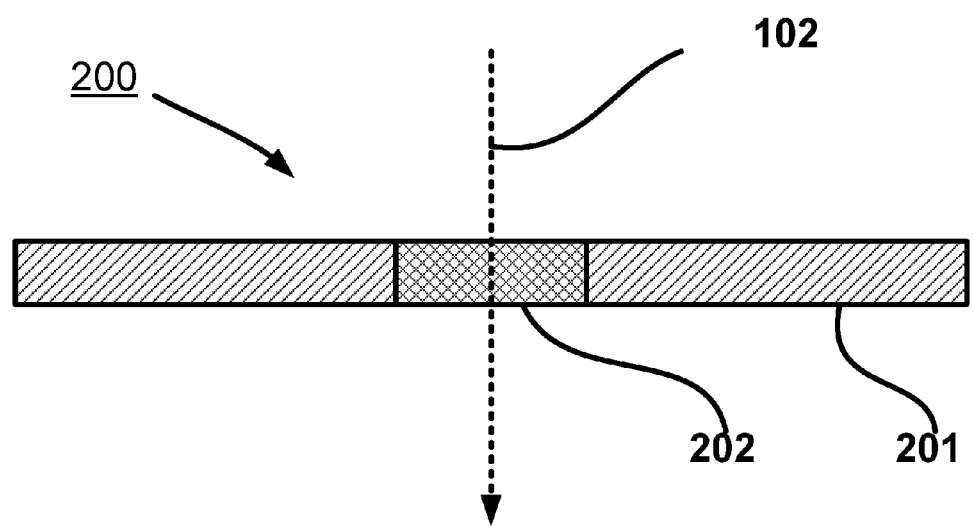
Figure 3:
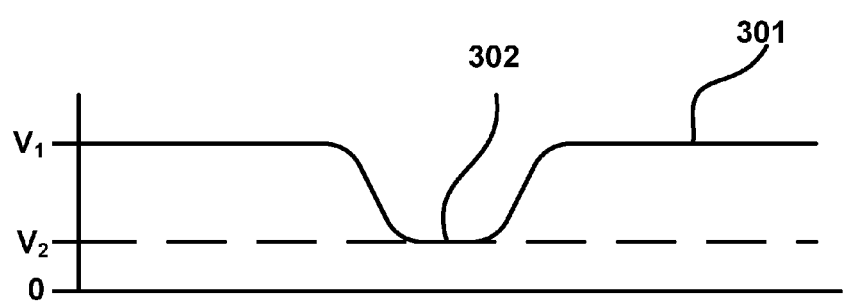
Figure 4:
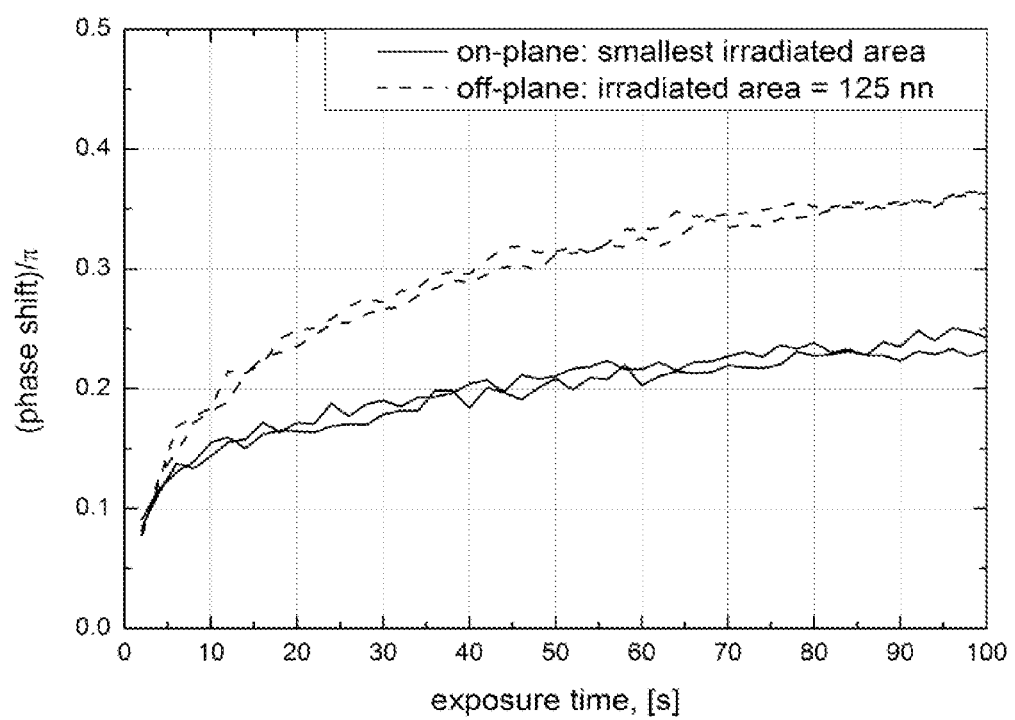

The invention is now explained using figures, in which identical numerals refer to corresponding features. To that end:

FIG. 1 schematically shows a TEM 100 equipped with a phase plate,

FIG. 2 schematically shows the thin film 200 that is irradiated in an area surrounding the axis of the electron microscope, FIG. 3 schematically shows the potential of the thin film after irradiation, and FIG. 4 schematically shows the phase shift induced as a function of irradiation time.

Figure 5:
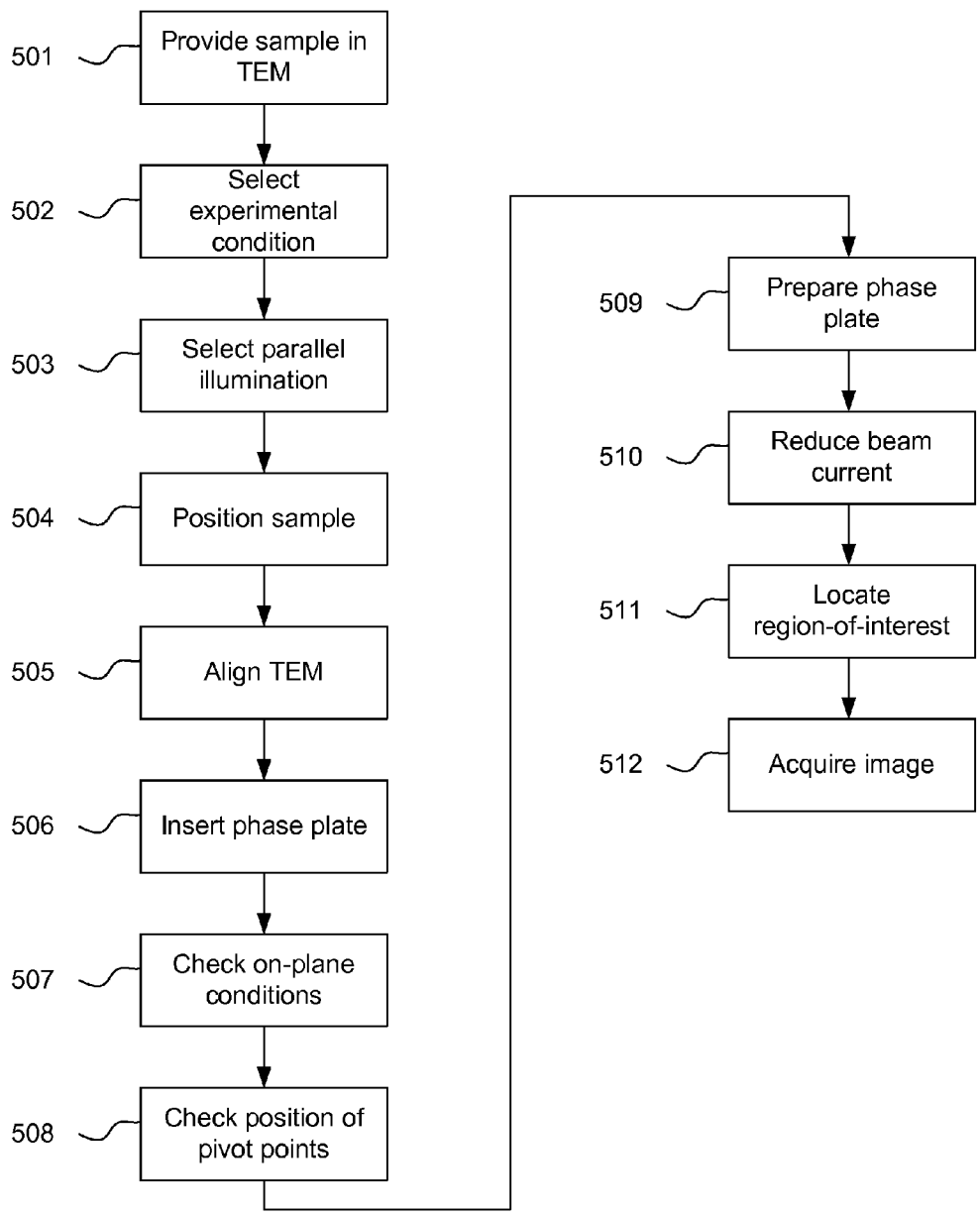

FIG. 5 schematically shows a workflow for operating a transmission electron microscope equipped with a phase plate according to the invention.

FIG. 1 schematically shows a TEM 100 equipped with a phase plate.

FIG. 1 shows a particle source 104 producing a beam of particles, such as electrons, along optical axis 102. The particles have a selectable energy of typically between 80-300 keV, although higher energies, e.g. 400 keV-1 MeV, or lower energies, e.g. 50 keV, may be used. The beam of particles is manipulated by condenser system 106 to form a parallel beam impinging on a sample 108, the sample positioned with a sample holder 110. The sample holder can position the sample with respect to the optical axis and may shift the sample in the plane perpendicular to the optical axis and tilt the sample with respect to said axis. Objective lens 112 forms a magnified image of the sample. The objective lens is followed by a magnifying system 116, e.g. a doublet of lenses, forming an enlarged image of the back-focal plane 114 of the objective lens. A phase plate 118 is placed in the enlarged image of the back-focal plane of the objective lens, this conjugated plane positioned between the magnifying system and a projection system 122. The phase plate is positioned with a manipulator 120, allowing the phase plate to be centered round the optical axis. The projection system forms a magnified image of the sample on a detector 124, thereby revealing sample details of e.g. 0.1 nm. The detector may take the form of a fluorescent screen, or e.g. a CCD or CMOS camera. In the case of e.g. a fluorescent screen the screen can be viewed via the glass window 126.

To align the optical components on the axis the TEM comprises a large number of deflectors, schematically shown as 128-1 . . . 128-7, although other deflectors on other places may be included.

It is noted that the phase plate may also be positioned in the back-focal plane itself, in which case the magnifying system 116 is superfluous.

The phase plate is normally formed as a thin film surrounded by a holder structure, for example a platinum aperture as commonly used in electron microscopy. Forming the phase plate with such an aperture has as an advantage that a standard aperture holder can be used to hold and position the phase plate. It is noted that heated aperture holders are known, the heating used to avoid contamination.

By now exposing the thin film to a large dose of energetic electrons, for example 200 keV electrons, knock-on damage occurs, resulting in electron traps. This may be thought of as p-type dopants. The resulting change in electronic structure, here referred to as a change in Galvani potential, causes a local change in external potential.

FIG. 2 schematically shows the thin film 200 that is irradiated in an area surrounding the axis 102 of the electron microscope. As a result the electronic structure of the area 202 is changed, while that of the non-irradiated area 201 is unchanged.

FIG. 3 schematically shows the potential of the thin film after irradiation. Removed from the axis the potential equals the chemical potential, but the irradiated area has an added (negative) electronic potential.

Undiffracted electrons, travelling towards and through the irradiated part 202 of the thin film, experience less acceleration than diffracted electrons travelling through other parts of the thin film, as V2 is less than V1. This causes a positive phase contrast when the beams interfere in the image plane to form an image.

FIG. 4 schematically shows the phase shift induced as a function of irradiation time.

Inventors found that the phase shift is not a linear function of the dose deposited on the thin film. This implies that there is an upper limit to the Galvani potential induced by the electron beam. Inventors also found that when a larger area (dotted line, irradiated area with a diameter of 125 nm) was irradiated using an identical total beam current as a small area (solid line), the large area resulted in a large phase shift than the small area. This can be explained as follows: First, assume that a maximum vacuum potential can be induced. Then compare two electron beams, one passing through the irradiated part and one far removed from this part, and define z along the electron-optical axis 102. The integral $\int_{-\infty}^{\infty} V(z)dz$ (more accurately from the sample plane to the image plane) differs due to the vacuum potential. When the spot that is irradiated grows, the difference between the two integrals scales with the size of the spot (assuming the same vacuum potential). Therefore the phase shift can be tuned by controlling the size of the spot that is irradiated during the preparation of the phase plate. The curves shown in FIG. 4 are obtained at identical beam current. It will be clear to the skilled person that a higher beam current, as is achievable using a larger spot size, results in a quicker settling time.

FIG. 5 schematically shows a workflow for operating a transmission electron microscope equipped with a phase plate according to the invention.

In step 501 a sample is provided in the transmission electron microscope (TEM).

In step 502 the experiments' conditions are selected, the conditions including electron beam energy, spot size condenser aperture (implying the selection of a beam current), magnification, etc.

In step 503 the condenser is set to illuminate the sample with a parallel beam of electrons.

In step 504 the sample is positioned to eucentric height (where the sample can be tilted without height variations) and focus is set (so that parallel beams in the sample plane result in focused beams in the back-focal plane of the objective lens).

In step 505 standard microscope alignments are performed.

In step 506 the phase plate is inserted in the beam path. The phase plate is inserted only now to minimize unwanted exposure (irradiation) of the phase plate.

In optional step 507 on-plane conditions (indicating whether the phase plate is exactly in the back-focal plane or slightly removed from it) are checked, for example using features on the phase plate, and the condenser lens is adjusted if necessary. As discussed earlier, by working slightly off-plane the size of the irradiated area can be tuned/selected. It is noted that the phase plate need not be in the back-focal plane, but may reside in a plane conjugated to it.

In step 508 pivot point settings of the beam are checked and image shift, using e.g. the features on the phase plate, ensuring that a tilt of the beam entering the objective lens ideally results in a pure shift in the sample plane and a pure tilt in the back-focal plane of the objective lens (and thus the plane where the phase plate resides).

In step 509 the phase plate is prepared by keeping the beam on a clean area of the phase plate for an appropriate amount of time (for example based on earlier experiments), the amount of time depending on beam intensity (beam current), beam size and phase plate material. Typically this amounts to 10-100 seconds of irradiation time.

In step 510 the beam current is reduced to imaging conditions as are normal for imaging samples, after which a region of interest is located on the sample.

In step 511 an image is acquired.

As mentioned earlier, the phase plate can be a heated phase plate (with a regulated temperature of, for example, between 100° C. and 400° C.) to avoid contamination. It that case step 501 should also include thermal stabilization of said temperature so that drift of the phase plate becomes negligible.

The last steps 510 and 511 can be repeated until sufficient data is gathered from the sample. Refocusing, tilting and (mechanically) shifting the sample may be required.

Non-Patent Literature

[—1—] "Principles and Techniques of Electron Microscopy, Vol. 3: Biological applications", Ed. M. A. Hayat, ISBN-0-442-25674-4, Chapter 4: In-focus phase contrast electron microscopy, H. M. Johnson, Electron Optics Laboratory, Dept. of Biophysics, Roswell Park Memorial Institute, Buffalo, N.Y., USA, specifically page 174-176

[—2—] "Phase Contrast Enhancement with Phase Plates in Biological Electron Microscopy", K. Nagayama et al., Microscopy Today, Vol. 18 No. 4 (July 2010), pp. 10-13.

The invention claimed is:

1. A method of using a phase plate in a transmission electron microscope, the phase plate comprising a thin film, the method comprising:

introducing the phase plate in the transmission electron microscope;

conditioning the phase plate by irradiating the thin film with a focused electron beam, such that conditioning the phase plate does not result in the removal of thin film material;

introducing a sample in the transmission electron microscope; and forming an image of the sample using the conditioned phase plate, wherein:

conditioning the phase plate involves locally building up a vacuum potential resulting from a change in the electronic structure of the thin film by irradiating the phase plate with a focused beam of electrons, the vacuum potential leading to an absolute phase shift $|\phi|$ with a smaller value than at the non-irradiated thin film.

2. The method of claim 1 in which the phase plate is heated to avoid contamination.

3. The method of claim 1 in which the vacuum potential induces a positive phase shift relative to the non-irradiated thin film.

4. The method of claim 1 in which, after irradiating the phase plate with a beam comprising scattered and non-scattered electrons, the mutual position of phase plate and beam is changed, the phase plate is conditioned anew, after which the phase plate is again irradiated with a beam comprising scattered and non-scattered electrons.

5. The method of claim 1 in which the conditioning of the thin phase plate is achieved while a beam shift is applied relative to the beam position during imaging.

6. The method of claim 1 in which the conditioned area of the thin film is larger than area that is addressed by the (focused) undiffracted electron beam during imaging.

7. The method of claim 1 in which the thin film comprises markers and/or holes used to align the transmission electron microscope.

8. The method of claim 7 in which the markers have a size of one micrometer of smaller, are circularly shaped, and are positioned in a dense pattern.

9. The method of claim 1 in which the thin film comprises carbon, more specifically amorphous carbon.

10. The method of claim 1 in which the thin film has a thickness between 5 and 20 nm.

11. The method of claim 1 in which imaging the sample includes irradiating the sample with a parallel beam of electrons.

12. The method of claim 1 in which during conditioning the diameter of the focus of the focused beam is controlled to give a predetermined phase shift.

13. The method of claim 1 in which the vacuum potential resulting from a change in the electronic structure of the thin film includes a Volta potential.

14. A method of forming a thin film phase plate for a transmission electron microscope, comprising:

locally building up a vacuum potential including a Volta potential by irradiating a portion of the thin film with a focused electron beam to change the electronic structure of the irradiated portion of the thin film, the locally built-up vacuum potential leading to an absolute phase shift $|\phi|$ with a smaller value than at a non-irradiated portion of the thin film.

15. A thin film phase plate comprising a first portion having a first internal electronic structure that produces a vacuum potential to provide to an absolute phase shift $|\phi|$ with a smaller value than the phase shift of a second portion having a second internal electronic structure.

16. The thin film phase plate of claim 15 in which the first internal electronic structure is produced by irradiating the first portion with an electron beam.

17. The thin film phase plate of claim 15, in which the vacuum potential induces a positive phase shift relative to the non-irradiated thin film.

18. The thin film phase plate of claim 15, in which the first internal electronic structure comprises carbon, more specifically amorphous carbon.

19. The thin film phase plate of claim 15, in which the first internal electronic structure has a thickness between 5 and 20 nm.

20. A charged particle apparatus, comprising:
a charged particle column for directing the beam of electrons towards a sample;
a sample holder for holding the sample; and
the phase plate of claim 15.

* * * * *